(12) United States Patent
Hush et al.

(10) Patent No.: US 12,249,377 B2
(45) Date of Patent: Mar. 11, 2025

(54) APPARATUSES AND METHODS FOR ORGANIZING DATA IN A MEMORY DEVICE

(71) Applicant: Lodestar Licensing Group, LLC, Evanston, IL (US)

(72) Inventors: Glen E. Hush, Boise, ID (US); Aaron P. Boehm, Boise, ID (US); Fa-Long Luo, San Jose, CA (US)

(*) Notice: Subject to any disclaimer, the term of this patent is extended or adjusted under 35 U.S.C. 154(b) by 0 days.

(21) Appl. No.: 18/225,574

(22) Filed: Jul. 24, 2023

(65) Prior Publication Data

US 2024/0161830 A1  May 16, 2024

Related U.S. Application Data

(63) Continuation of application No. 17/398,914, filed on Aug. 10, 2021, now Pat. No. 11,710,524, which is a
(Continued)

(51) Int. Cl.
*G11C 7/00* (2006.01)
*G06F 17/16* (2006.01)
(Continued)

(52) U.S. Cl.
CPC .............. *G11C 16/10* (2013.01); *G06F 17/16* (2013.01); *G11C 5/02* (2013.01); *G11C 7/1039* (2013.01);
(Continued)

(58) Field of Classification Search
CPC .... G11C 7/02; G11C 7/18; G11C 7/06; G11C 11/4091; G11C 11/4097
(Continued)

(56) References Cited

U.S. PATENT DOCUMENTS 5,093,805 A * 3/1992 Singh ..................... G11C 8/00
365/230.01
6,418,063 B1  7/2002 Seitsinger et al.
(Continued)

FOREIGN PATENT DOCUMENTS

KR  10-2014-0046386 A  4/2014
KR  10-2017-0134989 A  12/2017
(Continued)

OTHER PUBLICATIONS

International Search Report and Written Opinion from related international application No. PCT/US2019/063373, dated Mar. 24, 2020, 11 pages.

*Primary Examiner* — Son T Dinh
(74) *Attorney, Agent, or Firm* — Brooks, Cameron & Huebsch, PLLC (57) ABSTRACT

Systems, apparatuses, and methods related to organizing data to correspond to a matrix at a memory device are described. Data can be organized by circuitry coupled to an array of memory cells prior to the processing resources executing instructions on the data. The organization of data may thus occur on a memory device, rather than at an external processor. A controller coupled to the array of memory cells may direct the circuitry to organize the data in a matrix configuration to prepare the data for processing by the processing resources. The circuitry may be or include a column decode circuitry that organizes the data based on a command from the host associated with the processing resource. For example, data read in a prefetch operation may be selected to correspond to rows or columns of a matrix configuration.

20 Claims, 8 Drawing Sheets

Related U.S. Application Data continuation of application No. 17/019,602, filed on Sep. 14, 2020, now Pat. No. 11,100,998, which is a continuation of application No. 16/231,224, filed on Dec. 21, 2018, now Pat. No. 10,818,359.

(51) Int. Cl.
| | |
|---|---|
| *G11C 5/02* | (2006.01) |
| *G11C 7/10* | (2006.01) |
| *G11C 8/14* | (2006.01) |
| *G11C 16/04* | (2006.01) |
| *G11C 16/08* | (2006.01) |
| *G11C 16/10* | (2006.01) |

(52) U.S. Cl.
CPC ............ *G11C 8/14* (2013.01); *G11C 16/0483* (2013.01); *G11C 16/08* (2013.01)

(58) Field of Classification Search
USPC .......................... 365/189.14, 189.18, 189.12
See application file for complete search history.

(56) References Cited

U.S. PATENT DOCUMENTS

| | | | |
|---|---|---|---|
| 7,916,570 | B2 | 3/2011 | Ware et al. |
| 9,064,603 | B1 | 6/2015 | Youn |
| 9,274,884 | B2 | 3/2016 | Mateescu et al. |
| 9,281,052 | B2 | 3/2016 | Matsui |
| 10,818,359 | B2 | 10/2020 | Hush |
| 11,100,998 | B2 | 8/2021 | Hush |
| 2006/0250870 | A1 | 11/2006 | Cho |
| 2011/0205828 | A1 | 8/2011 | Richter |
| 2013/0155792 | A1 | 6/2013 | Matsui |
| 2015/0178246 | A1 | 6/2015 | Herrero et al. |
| 2016/0125920 | A1* | 5/2016 | Kim ................. G11C 7/1084 365/189.011 |
| 2016/0216910 | A1* | 7/2016 | Phan ................. G06F 3/0604 |
| 2016/0306631 | A1 | 10/2016 | Vorbach |
| 2017/0286112 | A1 | 10/2017 | Espasa et al. |
| 2018/0246669 | A1 | 8/2018 | Redfern et al. |
| 2018/0246855 | A1 | 8/2018 | Redfern et al. |

FOREIGN PATENT DOCUMENTS

| | | |
|---|---|---|
| WO | 9910792 A2 | 3/1994 |
| WO | 0188924 A1 | 11/2001 |
| WO | 2018/156398 A1 | 8/2018 |

* cited by examiner

APPARATUSES AND METHODS FOR ORGANIZING DATA IN A MEMORY DEVICE

PRIORITY INFORMATION

This application is a Continuation of U.S. application Ser. No. 17/398,914, filed Aug. 10, 2021, which is a Continuation of U.S. application Ser. No. 17/019,602, filed Sep. 14, 2020, now issued as U.S. Pat. No. 11,100,998 on Aug. 24, 2021, which is a Continuation of U.S. application Ser. No. 16/231,224, filed Dec. 21, 2018, issued as U.S. Pat. No. 10,818,359 on Oct. 27, 2020, the contents of which are incorporated herein by reference.

TECHNICAL FIELD

The present disclosure relates generally to semiconductor memory and methods, and more particularly, to apparatuses and methods for organizing prefetch data in a memory device.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can include a number of functional units such as arithmetic logic unit (ALU) circuitry, floating point unit (FPU) circuitry, and a combinatorial logic block, for example, which can be used to execute instructions by performing logical operations such as AND, OR, NOT, NAND, NOR, and XOR, and invert (e.g., inversion) logical operations on data (e.g., one or more operands). For example, functional unit circuitry may be used to perform arithmetic operations such as addition, subtraction, multiplication, and division on operands via a number of operations. Memory devices without logic for ordering information may contribute to increased latency, or may not ameliorate latency issues, associated with such arithmetic or matrix operations.

DETAILED DESCRIPTION

The present disclosure includes systems, apparatuses and methods associated with organizing data in a matrix format on a memory device. In a number of embodiments, an apparatus includes an array of memory cells and a controller coupled to the array of memory cells. The apparatus may further include the controller directing circuitry to transfer data from the array of memory cells to a number of sense amplifiers and select and transfer at least a portion of the data from the number of sense amplifiers to an input/output (I/O) component that can include DQs and a buffer. The transfer of the portion of the data from the number of sense amplifiers to the I/O component can be at least in part a prefetch operation. The apparatus may further include the controller directing circuitry to organize, corresponding to a matrix configuration, the data transferred in a prefetch operation.

A number of components in a computing system may be involved in providing instructions to the functional unit circuitry for execution. The instructions may be executed, for instance, by a processing resource such as a controller and/or host processor. Data (e.g., the operands on which the instructions will be executed) may be stored in an array of memory cells that is accessible by the functional unit circuitry. In many instances, the processing resources (e.g., processor and/or associated functional unit circuitry) may be external to the array of memory cells, and data is accessed via a bus between the processing resources and the array of memory cells to execute a set of instructions.

In some instances, data is read by the processing resources in the order that the data is stored in the array of memory cells. Accessing the data in this manner may reduce throughput (e.g., rate and/or efficiency) from the array of memory cells to the processing resources because the processing resources may need to reorder, organize, or otherwise manipulate the data before instructions can be executed on the data. The reduced throughput to the processing resources may reduce the overall performance of the computing system.

In a number of embodiments of the present disclosure, data can be organized by circuitry coupled to an array of memory cells prior to the processing resources executing instructions on the data. The organization of data may thus occur on a memory device, rather than at an external processor. In some examples, a controller coupled to the array of memory cells directs the circuitry to organize the data in a matrix configuration to prepare the data for processing by the processing resources. In some embodiments, the circuitry may be column decode circuitry, that can include a multiplexer, that organizes the data based on a command from the host associated with the processing resource. For example, data transferred from a number of sense amplifiers to an input/output component may be sent from a memory device in an order to correspond to successive rows of a matrix configuration for use by a host. Alternatively, the data from the array of memory cells may be organized by the column decode circuitry to correspond to successive columns of a matrix configuration. In a number of embodiments, spatial characteristics of the matrix configuration such as size of matrix, number of matrices per prefetch operation, etc. may be varied based on the command from the host, which may depend on the current requirements of the computing system.

A number of embodiments of the present disclosure further include data being transformed by the column decode circuitry to reorder data from a matrix configuration to a linear configuration to prepare the data for writing to the array of memory cells. For example, data can be received by a memory device and the column decode circuitry can transform the data by rearranging the order in which the bits of data are written to a number of sense amplifiers. The data may be received such that the bits correspond to columns of a matrix configuration and the column decode circuitry can transform the data such that the bits of data corresponding to a column on a matrix are not stored adjacent to each other in the sense amplifiers, but that the bits of data corresponding to the column are separated by one less sense amplifiers than the number of bits in a row of the matrix, for example. The memory device can receive data corresponding to the next column in the matrix and the data can be organized by the column decode circuitry to be stored in the sense amplifiers next to sense amplifiers storing the prior column.

Performing a prefetch operation (e.g., a portion of a read operation that transfers data from sense amplifiers to an input/output component) and/or a write operation to the array of memory cells in the manner described herein may reduce the number of steps typically carried out by the processing resource. Thus, a number of embodiments of the present disclosure may provide various benefits including improved throughput (e.g., increased speed, rate, and/or efficiency) associated with accessing (e.g., reading, writing, etc.) data values stored in the array of memory cells.

The figures herein follow a numbering convention in which the first digit or digits of a reference number correspond to the figure number and the remaining digits identify an element or component in the figure. Similar elements or components between different figures may be identified by the use of similar digits. For example, 130 may reference element "30" in FIG. 1, and a similar element may be referenced as 230 in FIG. 2.

Figure 1:
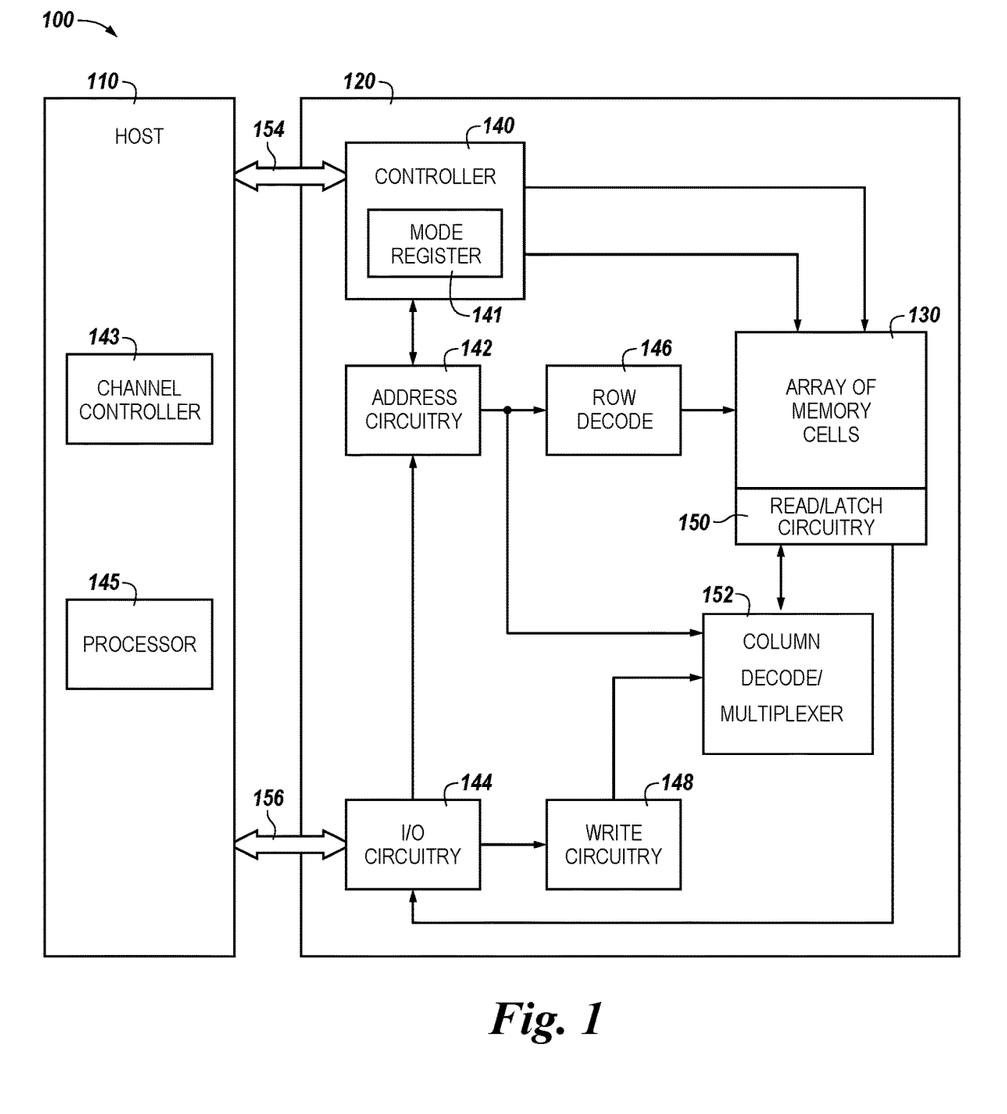
FIG. 1 is a block diagram of an apparatus in the form of a computing system including a memory device in accordance with a number of embodiments of the present disclosure.

FIG. 1 is a block diagram of an apparatus in the form of a computing system 100 including a memory device 120 in accordance with a number of embodiments of the present disclosure. The system 100 may be a laptop computer, tablet computer, personal computer, digital camera, digital recording and playback device, mobile telephone, personal digital assistant (PDA), memory card reader, interface hub, sensor, autonomous or semi-autonomous motor vehicle, autonomous or semi-autonomous manufacturing robot, Internet-of-Things (IoT) enabled device, among other systems.

In a number of embodiments, reading and/or writing data and associated commands may utilize a data path and timing in a DRAM device based upon pre-existing protocols (e.g., DDR3, DDR4, LPDDR, etc.). As used herein, data movement is an inclusive term that includes, for instance, copying, transferring, and/or transporting data values from a source location to a destination location, such as from an array of memory cells to processing resources or vice versa. As the reader will appreciate, while a DRAM-style memory device is discussed with regard to examples presented herein, embodiments are not limited to a DRAM implementation.

In a number of embodiments, a row (e.g., as shown at 219 in FIG. 2 and at corresponding reference numbers elsewhere herein) of virtual address space in a memory device (e.g., as shown at 120 in FIG. 1) may have a bit length of 16 K bits (e.g., corresponding to 16,384 memory cells or complementary pairs of memory cells in a DRAM configuration). Read/latch circuitry (e.g., as shown at 150 in FIG. 1 and at corresponding reference numbers elsewhere herein) for such a 16 K bit row may include a corresponding 16 K sense amplifiers (e.g., as shown at 306 in FIG. 3 and at corresponding reference numbers elsewhere herein) and associated circuitry formed on pitch with the sense lines selectably coupled to corresponding memory cells in the 16 K bit row. A sense amplifier in the memory device may operate as a cache for a single data value (bit) from the row of memory cells sensed by the read/latch circuitry 150. More generally, a number of embodiments of the present disclosure includes read/latch circuitry 150 (e.g., sense amplifiers 306 and associated circuitry), which may be formed on pitch with sense lines of an array of memory cells. The read/latch circuitry and other data storage components described herein are capable of performing data sensing and/or storage (e.g., caching, latching, buffering etc.) of data local to the array of memory cells.

In order to appreciate the improved data movement techniques that are based on organizing data in a matrix, a discussion of an apparatus for implementing such techniques (e.g., a memory device 120 having these capabilities and an associated host 110) follows.

As shown in FIG. 1, the system 100 may include a host 110 coupled (e.g., connected) to a memory device 120. The memory device 120 includes an array of memory cells 130 and a controller 140, among the various other circuitry for organizing data in a matrix configuration and transforming data from a matrix configuration to a linear configuration, as shown and described herein. The host 110 may be responsible for execution of an operating system (OS) and/or various applications that may be loaded thereto (e.g., from the memory device 120 via the controller 140). The host 110 may include a system motherboard and backplane and may include a number of processing resources (e.g., one or more processors 160, microprocessors, or some other type of controlling circuitry) capable of accessing the memory device 120 (e.g., via controller 140) to perform operations on data values organized in a matrix configuration. The controller 140 also may, in a number of embodiments, include a number of processing resources for performance of processing operations.

As further shown in FIG. 1, the controller 140 may include or may be coupled to a mode register 141. The mode register 141 may be directed by the controller 140 to be set in a particular setting that corresponds to a size of a matrix configuration. For instance, a particular setting of the mode register may correspond to dimensions of a matrix, e.g., M×N. It should be noted that data transferred from the array of memory cells 130 to a number of sense amplifiers can be organized into successive matrices of a particular size in a number of prefetch operations, as further described below in connection with FIG. 4. The system 100 may include separate integrated circuits or both the host 110 and the memory device 120 may be on the same integrated circuit. The system 100 may, for instance, be a server system and a high performance computing (HPC) system or a portion thereof. Although the example shown in FIG. 1 illustrates a system having a Von Neumann architecture, embodiments of the present disclosure may be implemented in non-Von Neumann architectures, which may not include one or more components (e.g., CPU, ALU, etc.) often associated with a Von Neumann architecture.

The controller 140 (e.g., control logic and sequencer) may include control circuitry, in the form of hardware, firmware, or software, or combinations thereof. As an example, the controller 140 may include a state machine, a sequencer, and/or some other types of control circuitry, which may be implemented in the form of an application specific integrated circuit (ASIC) coupled to a printed circuit board. In a number of embodiments, the controller 140 may be co-located with the host 110 (e.g., in a system-on-chip (SOC) configuration).

For clarity, description of the system 100 has been simplified to focus on features with particular relevance to the present disclosure. For example, the array of memory cells 130 may be a DRAM array, SRAM array, STT RAM array, PCRAM array, TRAM array, RRAM array, FeRAM array, phase-change array of memory cells, 3D Xpoint™ array, NAND flash array, and/or NOR flash array. The array of memory cells 130 may include memory cells arranged in rows (e.g., in a plurality of subarrays) and columns. The memory cells may be coupled to one another by access lines (which may be referred to herein as word lines or select lines) to form rows. Additionally, the memory cells may be coupled to one another by sense lines (which may be referred to herein as data lines or digit lines) to form columns. Although a single array of memory cells 130 is shown in FIG. 1, embodiments are not so limited. For instance, memory device 120 may represent a plurality of array of memory cells 130 (e.g., array of memory cells included in a number of banks of DRAM cells, NAND flash cells, etc.) in addition to a plurality of subarrays, as described herein. Accordingly, descriptions in the present disclosure may be made with regard to DRAM architectures by way of example and/or clarity. However, unless explicitly stated otherwise, the scope of the present disclosure and claims is not limited to DRAM architectures.

As further shown in FIG. 1, the memory device 120 may include address circuitry 142 to latch address signals provided over a data bus 156 (e.g., an I/O bus from host 110) by I/O circuitry 144 (e.g., provided to external ALU circuitry and to DRAM DQs via local I/O lines and global I/O lines) included within the memory device 120. As further shown in FIG. 1, the host 110 may include a channel controller 143. Status and exception information may be provided from the controller 140 of the memory device 120 to the channel controller 143, for example, through a control bus 154, which in turn may be provided from the channel controller 143 to host 110. Address signals may be received (e.g., from channel controller 143 or another host component) through address circuitry 142 and may be decoded via a row decoder 146 and/or a column decoder 152 to access the array of memory cells 130.

Data may be sensed (read) from the array of memory cells 130 by sensing voltage and/or current changes on sense lines (digit lines) using sense amplifiers (e.g., shown as read/latch circuitry 150 in FIG. 1). Data may be sensed from the array of memory cells 130 in prefetch sizes of 256 bits, 128 bits, 64 bits, among other possibilities. The read/latch circuitry 150 may include a number of sense amplifiers, as described herein, to read and latch a page (e.g., a row or a portion of a row) of data from the array of memory cells 130. The input-output (I/O) circuitry 144 may include data I/O pins to be used for bi-directional data communication with host 110 over the data bus 156 (e.g., a 64 bit wide data bus, a 128 bit wide data bus, a 256 bit wide data bus, etc.). The memory device 120 may further include write circuitry 148 that may be used to write data to the array of memory cells 130.

The controller 140 may decode signals (e.g., commands) provided by control bus 154 from host 110. The controller 140 may be configured to receive a command from the host 110 regarding organizing data read from the array of memory cells 130 into a matrix configuration. For example, the controller 140 may receive a command to organize the data in successive matrices of a particular size. The controller 140 may control operations by issuing signals determined from the decoded commands from host 110. These signals may include chip enable signals, write enable signals, address signals (e.g., subarray address signals, row address signals, and/or latch address signals) that may be used to control operations performed on the array of memory cells 130, including data sense, data store, subarray addressing, row addressing, latch addressing, data move, data write, and data erase operations, among other operations. In various embodiments, the controller 140 may be responsible for executing instructions from host 110 and accessing the array of memory cells 130 for a prefetch operation or a write operation.

As further shown in FIG. 1, the memory device 120 includes a column decode circuitry/multiplexer 152. The controller 140 may be capable of directing circuitry such as the read/latch circuitry 150 to transfer data values from the array of memory cells 130. In a number of embodiments, the controller 140 may direct the column decode circuitry 152 to organize data transferred in a prefetch operation such that the data is send from the memory device 120 in a matrix configuration (e.g., a prefetch operation sends data that corresponds to a portion of a matrix configuration, such as a row or column, for example). Additionally or alternatively, the controller may direct the column decode circuitry 152 to transform data received by the I/O circuitry 144 from a matrix configuration to a linear configuration. The data may be received by the I/O circuitry 144 via the data bus 156 from the host 110. The transformation to the linear configuration may be to prepare the data for writing to the array of memory cells 130 by write circuitry 148.

Figure 2:
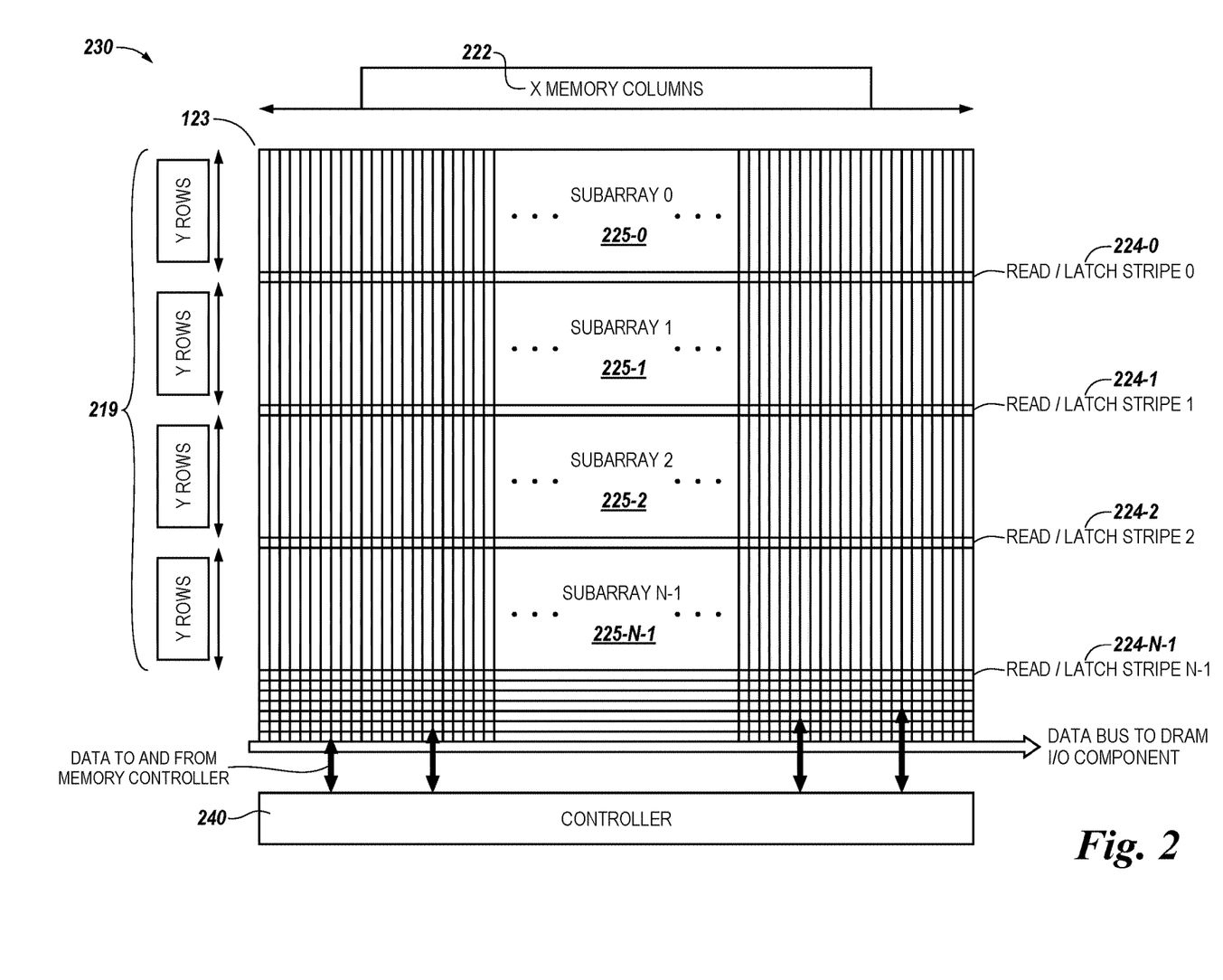
FIG. 2 is a block diagram of an array of memory cells of the memory device and a controller of the memory device in accordance with a number of embodiments of the present disclosure.

FIG. 2 is a block diagram of an array of memory cells 230 of the memory device and a controller 240 of the memory device in accordance with a number of embodiments of the present disclosure. The architecture of the array of memory cells 230 may include a plurality of columns (e.g., "X" columns 222 as shown in FIG. 2). Additionally, the array 230 may be divided into a plurality of subarrays 225-0 (SUBARRAY 0), 225-1 (SUBARRAY 1), . . . , 225-N−1 (SUBARRAY 225-N−1), which may be separated by respective amplification regions that may include groups (e.g., sets) of sense amplifiers. The groups of sense amplifiers may be referred to as sense amplifier stripes or read/latch stripes. For example, as shown in FIG. 2, each of the subarrays 225-0, 225-1, . . . , 225-N−1 has an associated read/latch stripe associated therewith (e.g., 224-0, 224-1, . . . , 224-N−1, respectively).

The array of memory cells 230 may include 64 subarrays, 128 subarrays, 256 subarrays, 512 subarrays, among various other possible numbers of subarrays. However, embodiments are not so limited, and some embodiments of an array of memory cells may have a different number of subarrays than just presented. In a number of embodiments, the subarrays 225 may have the same number of rows in each subarray (e.g., 256 rows, 512 rows, 1024 rows, 2048 rows, among various other possible numbers of rows). However, embodiments are not so limited, and at least some of a plurality of subarrays within the array of memory cells 230 may have different numbers of rows.

Each column 222 is configured to be coupled to read/latch circuitry (e.g., read/latch circuitry 150 as described in connection with FIG. 1 and elsewhere herein). As such, each column in a subarray may be coupled individually to a sense amplifier that contributes to a set of sense amplifiers (e.g., a read/latch stripe) for that subarray. For example, as shown in FIG. 2, the array of memory cells 230 may include read/latch stripe 0, read/latch stripe 1, . . . , read/latch stripe N-1, shown at 224-0, 224-1, . . . , 224-N-1, that each have read/latch circuitry with a set of sense amplifiers that may, in various embodiments, be used as registers, cache, and data buffering. The sense amplifiers (e.g., as shown at 306 and described in connection with FIG. 3) may be coupled to each column 222 in the subarrays 225-0, 225-1, . . . , 225-N-1. Each of the subarrays 225-0, 225-1, . . . , 225-N-1 may include a respective plurality of rows (e.g., a respective group of "Y" rows 219). Each read/latch stripe 224-0, 224-1, . . . , 224-N-1 can be coupled to column decode circuitry/multiplexer (e.g., column decode circuitry/multiplexer 152 in FIGS. 1 and 352 in FIG. 3) which can be coupled to an I/O component (e.g., I/O component circuitry 144 in FIGS. 1 and I/O component 344 in FIG. 3) to send data from the read/latch stripes to apparatus coupled to the array of memory cells 230.

FIG. 2 is a schematic diagram of a portion of a memory device in accordance with a number of embodiments of the present disclosure. FIG. 2 illustrates an example that includes 1T1C memory cells, in a folded DRAM configuration, that are each coupled to a sense amplifier 206. However, embodiments are not so limited, such that some embodiments may have memory cells in a 2T2C DRAM configuration.

Figure 3:
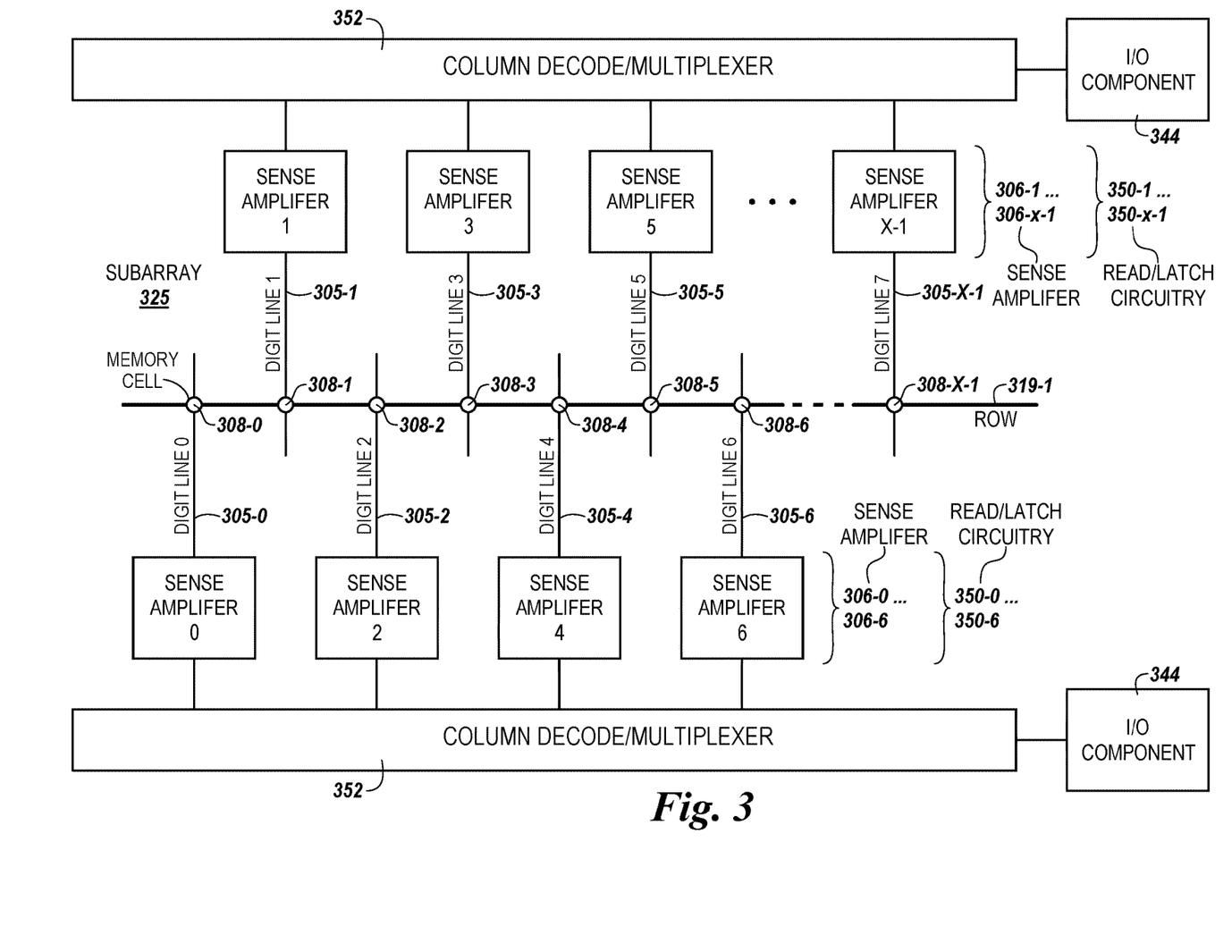
FIG. 3 is a schematic diagram illustrating a row of an array of memory cells in accordance with a number of embodiments of the present disclosure.

FIG. 3 is a schematic diagram illustrating a row of an array of memory cells in accordance with a number of embodiments of the present disclosure. As shown in FIG. 3, a portion of the subarray 325 includes a row 319-1 that may include a plurality of X memory cells 308-0 . . . 308-X-1. The memory cells 308-0 . . . 308-X-1 may be located at the intersection of a plurality of X digit lines 305-0 . . . 305-X-1 with the row 319-1. The plurality of digit lines 305-0 . . . 305-X-1 are referred to as DIGIT LINE 1 . . . DIGIT LINE X-1 in the illustration. The number X corresponds to a number of columns (e.g., the number of columns 222 shown in FIG. 2). As further shown in FIG. 3, the memory cells 308-0 . . . 308-X-1 may each be connected to associated read/latch circuitry 350-0 . . . 350-X-1, respectively. Each of the read/latch circuitry 350-0 . . . 350-X-1 includes a respective sense amplifier 306-0 . . . 306-X-1. The sense amplifiers 306-1 . . . 306-X-1 are referred to as sense amplifiers 1 . . . X-1 in the illustration. As illustrated, a sense amplifier associated with a memory cell is disposed between the memory cell and the column decode circuitry 352. The sense amplifier may be operated to determine a data value (e.g., logic state) stored in a selected memory cell. The sense amplifier 306 may include a cross coupled latch (not shown).

The sense amplifier 306 may be coupled to equilibration circuitry (not shown), which may be configured to equilibrate the sense lines 305-1 and 305-2.

Each memory cell of the plurality of memory cells may include a transistor serving as an access element and a capacitor serving as a storage element. The number of data values (e.g., voltages) sensed from the memory cells (e.g., in read operations) may correspond to the number of columns of memory cells that intersect a row of a subarray, such as row 319-1 of FIG. 3. For example, a total of X number of data values may be stored by the plurality of memory cells 308-0 . . . 308-X-1.

As further shown, the portion of the subarray 325 illustrated in FIG. 3 is connected to a column decode circuitry 352. In particular, each memory cell is connected to the column decode circuitry via a digit line associated with the memory cell and via a sense amplifier connected to the digit line, as shown. The column decode circuitry 352, in turn, is connected to an input-output component 344. An architecture such as that shown in FIG. 3 allows the column decode circuitry 352 to read data stored in each memory cell and organize the data independent of reading data stored in other memory cells.

A controller (e.g., the controller 140 in FIG. 1) may be configured to receive (e.g., from host 110) coded instructions for performance of a data movement operation from the selected row of a subarray of the array of memory cells (e.g., a read, write, erase operation, etc.) and/or a compute operation (e.g., a logical operation, such as a Boolean operation, among other logical operations performed by a processor, such as processor 160 in FIG. 1) on a data value stored by a memory cell of the selected row. For example, the controller may be configured to receive a command for an operation that includes a request for performance of a DRAM operation (e.g., a DRAM read and/or write operation). The controller may be further configured to sequence or organize the data values to correspond to a row in a matrix configuration when transferring data between the sense amplifier and an I/O component (e.g., the I/O circuitry 144 in FIG. 1). The controller may direct a column decode circuitry to organize the data values to correspond to the row in the matrix configuration. As such, the sense amplifiers described herein are configured to enable performance of memory operations and/or compute operations in connection with the selected row.

Figure 4:
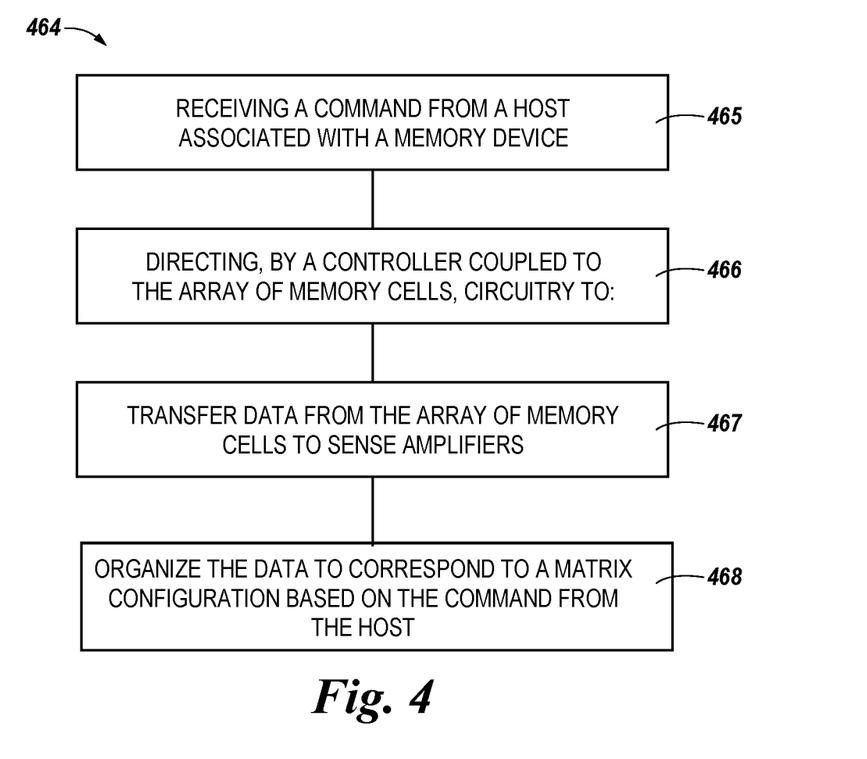
FIG. 4 is a flow chart for organizing data to correspond to a matrix (e.g., a matrix data structure) in accordance with the present disclosure.

FIG. 4 is a flow chart for organizing data to correspond to a matrix (e.g., a matrix data structure) in accordance with the present disclosure. Unless explicitly stated, elements of methods described herein are not constrained to a particular order or sequence. Additionally, a number of the method embodiments, or elements thereof, described herein may be performed at the same, or at substantially the same, point in time.

As shown in FIG. 4, at block 465, the method 464 may include receiving a command from a host associated with a memory device. For example, a controller (e.g., the controller 140 of FIG. 1) may receive a command from a host (e.g., the host 110 of FIG. 1) associated with a memory device (e.g., the memory device 130 of FIG. 1). Referring again to FIG. 4, the command or request from the host may include information regarding a characteristic of a matrix configuration that data read from the memory device is organized into, as detailed below in connection with block 468. For example, the controller may receive a command specifying a particular size of the matrix configuration, the relation between the number of rows of the matrix configuration and the number of columns of the matrix configuration, the number of matrices that result from organizing a single operation of data (e.g., a prefetch operation), the sizes of a plurality of matrices that result from organizing a single operation of data (e.g., a prefetch operation), whether the data being organized into the matrix configuration should correspond to successive rows of the matrix, successive columns of the matrix, or successive diagonals of the matrix configuration, the number of dimension(s) of a matrix, or some other spatial characteristic of the matrix configuration. In a number of embodiments, the command received by a controller from a host may specify a characteristic of the matrix configuration in order to prepare the data for processing by a processor (e.g., processor 160 of FIG. 1) of the host. The command may differ based on a user application currently being processed or based on previous patterns of application use known to the host.

At block 466, the method 464 may include directing, by a controller coupled to the array of memory cells, circuitry to carry out certain steps, for example the steps detailed in the discussion below regarding block 467 and block 468. As an example, the controller (e.g., the controller 140 shown in FIG. 1) may direct the column decode circuitry (e.g., the column decode circuitry 152) to carry out the steps detailed in the discussion below regarding block 467 and block 468. In a number of embodiments, the controller (e.g., the controller 140) may direct some combination of the column decode circuitry (e.g., column decode circuitry 152), the read/latch circuitry (e.g., the read/latch circuitry 150), the row decoder (the row decoder 146), the column decoder (e.g., the column decoder 152), the address circuitry (the address circuitry 142), and the input-output circuitry (e.g., the input-output circuitry 144) to carry out the steps detailed in the discussion below regarding block 467 and block 468.

At block 467, the method may include directing the circuitry to transfer data from an array of memory cells to sense amplifiers. For example, the controller (e.g., the controller 140 shown in FIG. 1) may direct the circuitry to transfer data in a from the array of memory cells (e.g., the array of memory cells 130). In a number of embodiments, the data may be stored in a plurality of sense amplifiers (e.g., the plurality of sense amplifiers 306-0 . . . 306-X–1 shown in FIG. 3), where X is the number of sense amplifiers in the plurality. The plurality of sense amplifiers may read the data by digit lines (e.g., the digit lines 305-0 . . . 305-X–1 of FIG. 3), respectively. The data value of each memory cell may be read by a dedicated sense amplifier that does not read data values from other memory cells, in a number of embodiments. For example, the data values of the plurality of memory cells may be read by the plurality of sense amplifiers, respectively. The controller may use the plurality of sense amplifiers to read and store the data.

At block 468, the method may include directing the circuitry to organize the data to correspond to a matrix configuration based on the command from the host. For example, the controller (e.g., the controller 140 of FIG. 1) may direct the column decode circuitry (e.g., the column decode circuitry 152 of FIG. 1) or other circuitry to organize the data transferred from the array of memory cells (e.g., the array of memory cells 130) to the sense amplifiers in a matrix configuration by selecting particular bits of data from sense amplifiers such that the selected bits correspond to a portion of a matrix configuration, such as a row/rows or column/columns of a matrix, for example. It should be noted that in a number of embodiments, the controller may further direct circuitry to read data from the array of memory cells in a prefetch operation, as described above in connection with block 467. In the number of embodiments, the controller may be coupled to the array of memory cells and both the controller and the array of memory cells may be included within a memory device (e.g., the memory device 120 shown in FIG. 1).

Referring again to block 468, the organization of the data to correspond to the matrix configuration can be carried out differently in a variety of different embodiments, as described below in connection with FIGS. 5A, 5B, 6A, and 6B. The method may further include providing the data to an input-output component (e.g., in the form of the I/O circuitry 144 shown in FIG. 1). For example, the controller may direct circuitry such as the column decode circuitry to provide the data to the I/O circuitry.

In a number of embodiments, the data transferred from the array of memory cells to the sense amplifiers can be organized in a matrix configuration having a particular size based on a command from the host during a prefetch operations. In a number of embodiments, the prefetch operation may be conducted on 256 bits at a time, for example.

Figure 5A:
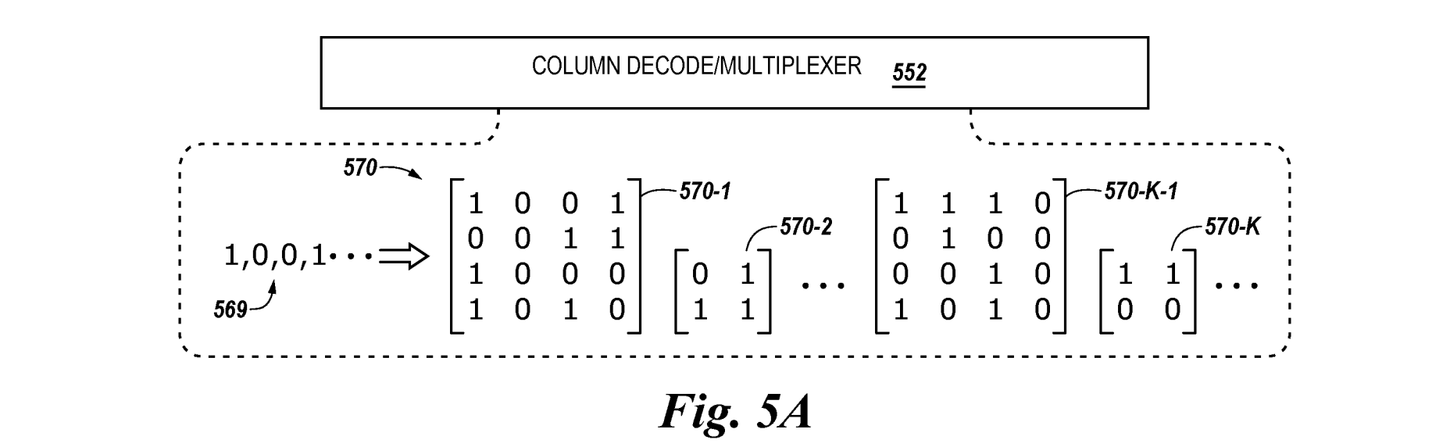
FIGS. 5A and 5B are schematic diagrams illustrating examples of organizing data to correspond to a matrix in accordance with a number of embodiments of the present disclosure.
Figure 5B:
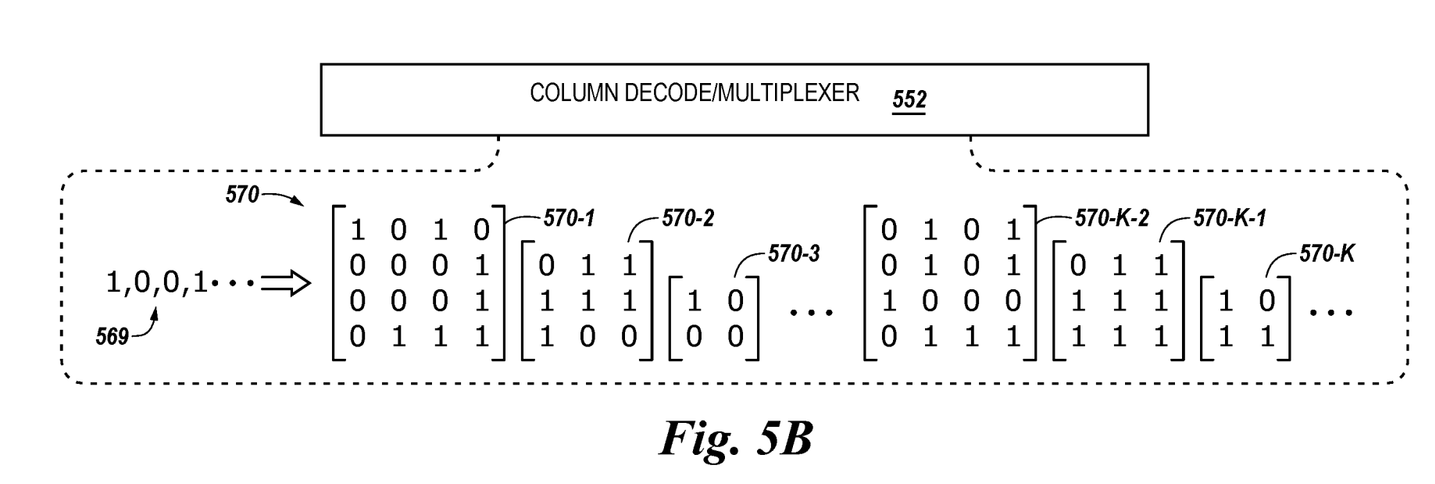

FIGS. 5A and 5B are schematic diagrams illustrating examples of organizing data to correspond to a matrix in accordance with a number of embodiments of the present disclosure.

As further shown in FIG. 5A, the column decode circuitry 552 can be directed by a controller coupled to an array of memory cells to organize data 569 read from the array of memory cells in a set of matrices 570. It should be noted that in an embodiment, a controller (e.g., the controller 140 of FIG. 1) may be coupled to the array of memory cells (e.g., the array of memory cells 130 of FIG. 1) and may be configured to direct the circuitry, such as the column decode circuitry 552, to perform certain operations. Additionally, the controller and the array of memory cells may be included within the memory device. The set of matrices 570 may include submatrix 570-1 (submatrix is sometimes referred to as matrix herein) having a first size and submatrix 570-2 having a second size, as shown in FIG. 5A, where the matrix 570-1 has a 4×4 size and the matrix 570-2 has a 2×2 size. In a number of embodiments, the size of the matrix 570-1 and the size of the matrix 570-2 are selected by a host associated with a memory device that includes the array of memory cells. As is illustrated in FIG. 5A, the size of the matrix 570-1 is different than the size of the matrix 570-2. The set of matrices 570 may include matrices of alternating size between 4×4 and 2×2 up to a total of K matrices. Referring again to FIG. 5A, the set of matrices 570 may include a third submatrix 570-K–1 having the same size as the first submatrix 570-1 (e.g., the first size) and a fourth submatrix 570-K having the same size as the second submatrix (e.g., the second size).

Alternatively, the set of matrices 570 may include a third submatrix 570-3 having a third size, as shown in FIG. 5B. The third size may be different than the first size and the third size may be different than the second size, as shown in the embodiment of FIG. 5B. The set of matrices 570 of FIG. 5B may include matrices having three different sizes being repeated from largest size to smallest size up to a total of K matrices. In a number of embodiments, the data may be organized to correspond to a diagonal of a matrix configuration. For example, in FIG. 5B, the prefetch operation includes organizing data that corresponds to a diagonal in the matrix configuration 570. In particular, the diagonal traverses the four rows and the four columns of the first matrix 570-1, from top left to bottom right of the matrix 570-1 of 5B.

Figure 6A:
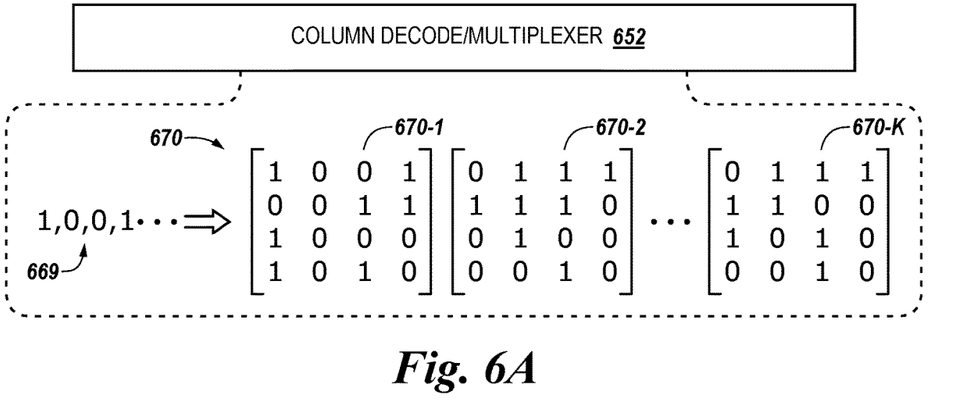
FIGS. 6A and 6B are schematic diagrams illustrating further examples of organizing data to correspond to a matrix in accordance with a number of embodiments of the present disclosure.
Figure 6B:
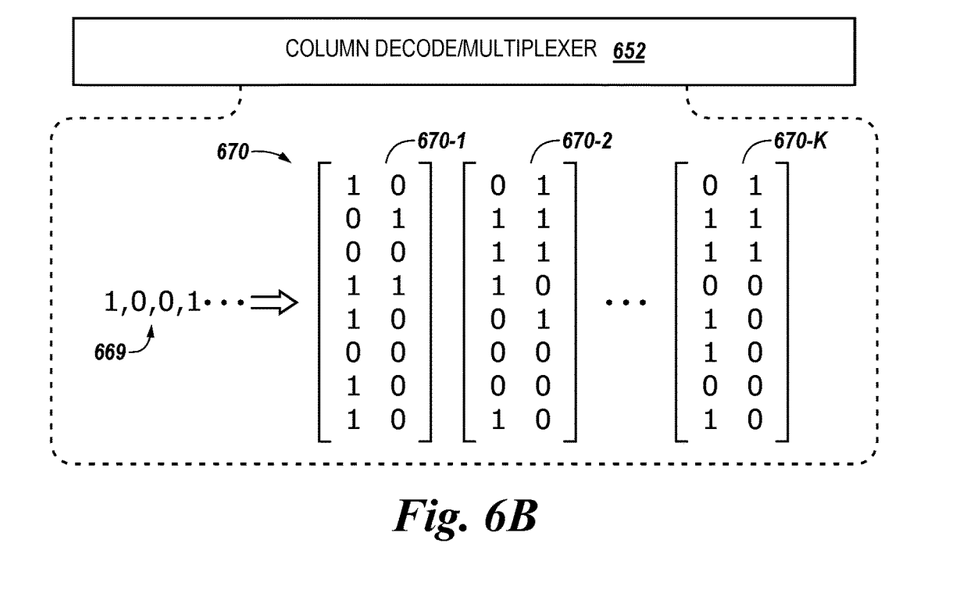

FIGS. 6A and 6B are schematic diagrams illustrating further examples of organizing data to correspond to a matrix in accordance with a number of embodiments of the present disclosure.

As shown in FIG. 6A, 256 bits read from 256 memory cells may be organized into matrices having a size of 4×4 (the 256 bits may be from 256 successive memory cells or from non-successive memory cells). FIG. 6A illustrates a column decode circuitry 652-1 organizing the data 669 to correspond a matrix configuration 670 that includes a plurality of matrices 670-1, 670-2, . . . 670-K. The matrices 670-1 . . . 670-K are identically sized at 4×4. A size of 4×4 refers to a matrix having four columns and four rows for a total of 16 bits for data storage. As shown in FIG. 6A, the size of the matrix (e.g., 16 bits) is defined by a product (4*4=16) of a first number of rows (e.g., 4) and a second number of columns (e.g., 4). In such an example, the controller would direct the column decode circuitry to organize the data to correspond to sixteen successive matrices of 4×4 size to accommodate the 256 bits of the prefetch operation. In other embodiments, the number of matrices corresponding to a single prefetch operation varies based on the size of the matrices and the size of the prefetch operation. As further illustrated in FIG. 6A, the prefetch operation corresponds to organizing data to correspond to a row in the matrix configuration 670. In particular, the first row of the matrix 670-1 of FIG. 6A includes the values 1001, which are the first four values in the data 669 read from the prefetch. In a number of embodiments, the matrix configuration may be a single matrix of a size that is equivalent to the number of bits in the prefetch operation. For example, the matrix may be 16×16 (16*16=256) for a prefetch operation that includes 256 bits.

Referring now to FIG. 6B, a column decode circuitry 652 may organize data 669 to correspond to a matrix configuration 670 that includes matrices 670-1, 670-2, 670-3 . . . 670-K, each having a size of 8×2, meaning that each matrix includes eight rows and two columns. As is apparent from FIG. 6B, the controller directs circuitry to organize the data into a set of matrices where the set of matrices includes a first matrix having a size that is equal to the size of the second matrix. As illustrated, the prefetch operation may correspond to organizing data to correspond to a column in the matrix configuration. In particular, the first four data values in the first column of the matrix 670-1 of FIG. 6B are 1001, which are the first four data values in the data 669 read in the prefetch.

Figure 7:
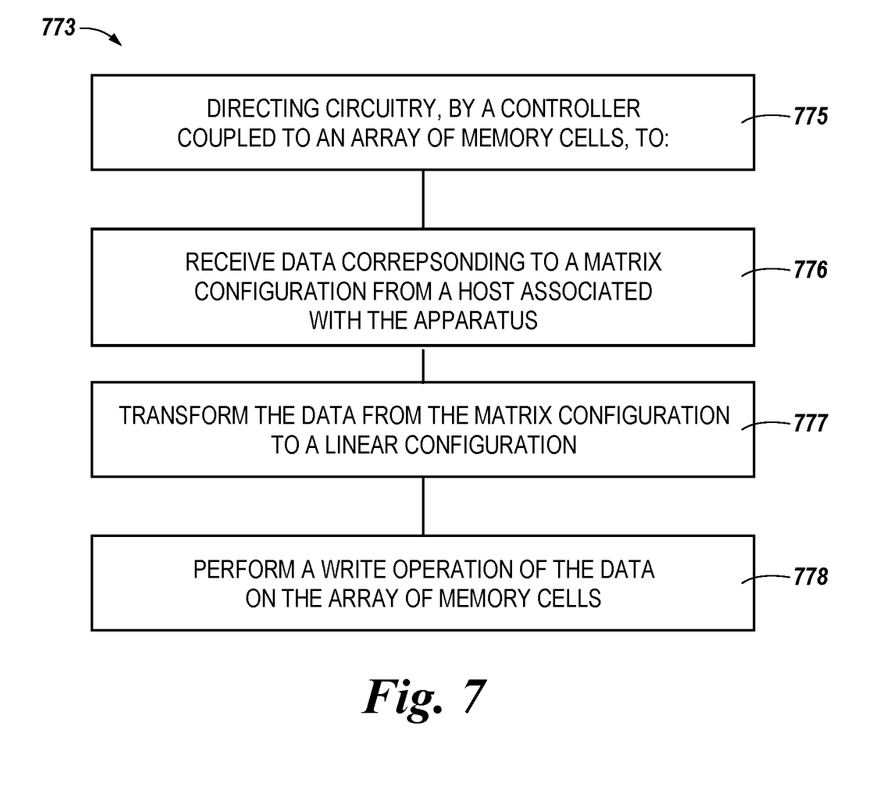
FIG. 7 is a flow chart for transforming data from a matrix configuration to a linear configuration in accordance with a number of embodiments of the present disclosure.

FIG. 7 is a flow chart of an embodiment of a method 773 for transforming data from a matrix configuration to a linear configuration in accordance with the present disclosure. Unless explicitly stated, elements of methods described herein are not constrained to a particular order or sequence. Additionally, a number of the method embodiments, or elements thereof, described herein may be performed at the same, or at substantially the same, point in time.

At block 775, the method may include directing circuitry, by a controller coupled to an array of memory cells, to carry out steps detailed in the discussion below in connection with blocks 776, 777, and 778. For example, the controller (e.g., the controller 140 of FIG. 1) may direct one or more components of the memory device (e.g., the memory device 120 of FIG. 1) to carry out the steps discussed in connection with blocks 776, 777, and 778. In a number of embodiments, the controller may be coupled to an array of memory cells (e.g., the array of memory cells 130), and both the controller and the array of memory cells may be included in the memory device.

At block 776, the method may include receiving data corresponding to a matrix configuration from a host associated with the apparatus. For example, the controller may direct an input-output component (e.g., the I/O circuitry 144 of FIG. 1) to receive data in a matrix configuration from the host that is associated with the memory device. The data may be received from a processor (e.g., the processor 160) of the host via a data bus (e.g., the data bus 156). A processor of a host may provide data to a memory device in a matrix configuration because carrying out a transformation of the data from the matrix configuration to a form more appropriate for writing to the memory device may place an excessive processing burden on the processor. The controller may further direct the I/O component to provide the data to one or more other components of the memory device, such as write circuitry (e.g., the write circuitry 148), a column decode circuitry (e.g., the multiplexer 152), a row decoder (e.g., the row decoder 146), and a column decoder (e.g., the column decoder 152). In a number of embodiments, the controller may further provide an address signal associated with the received data to address circuitry (e.g., the address circuitry 142 of FIG. 1).

At block 777, the method may include transforming the data from the matrix configuration to a linear configuration. For example, the controller may direct the column decode circuitry to transform the data from the matrix configuration to the linear configuration, as discussed in greater detail below in connection with FIGS. 8A, 8B, and 8C. The matrix configuration may include a first number of rows and a second number of columns.

At block 778, the method may include performing a write operation of the data on the array of memory cells. For example, the controller may direct the write circuitry and/or another component of the memory device to perform a write operation of the data on the array of memory cells. In a number of embodiments, the write operation of the data corresponds to the first row of the matrix configuration. The successive bits of a row of the matrix configuration, such as matrix configuration 870 of FIG. 8A may be written by the write circuitry to successive memory cells of a row of memory cells, such as the memory cells 308-0 . . . 308-X−1 of the row 319-1 of FIG. 3. Alternatively, the successive bits of a row of the matrix configuration, such as matrix configuration 870 of FIG. 8A may be written by the write circuitry to non-successive memory cells of the row of memory cells, such as the memory cells 308-0 . . . 308-X−1 of the row 319-1 of FIG. 3

Figure 8A:
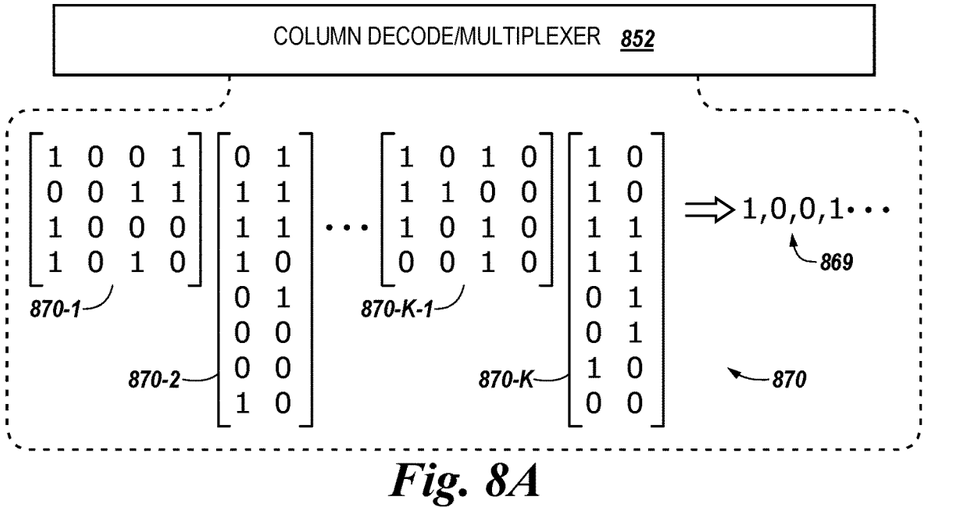
FIGS. 8A-8C are schematic diagrams illustrating examples of transforming data from a matrix configuration to a linear configuration in accordance with a number of embodiments of the present disclosure.
Figure 8B:
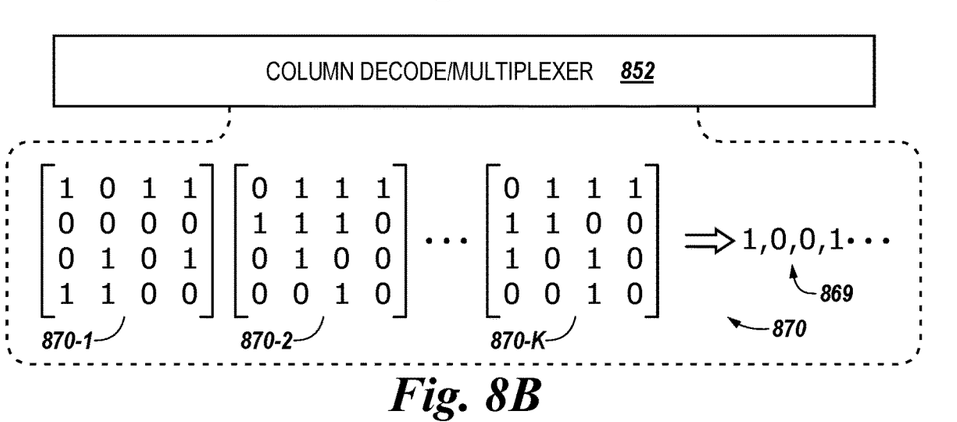
Figure 8C:
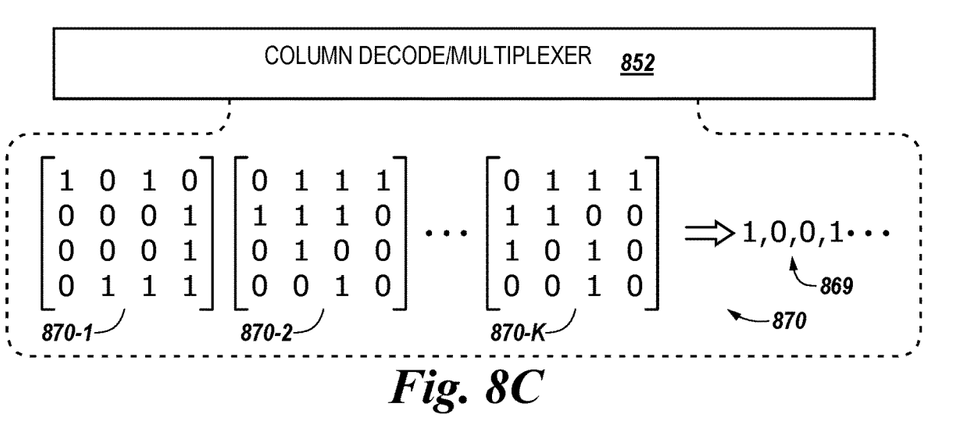

FIGS. 8A-8C are schematic diagrams illustrating examples of transforming data from a matrix configuration to a linear configuration in accordance with a number of embodiments of the present disclosure.

FIG. 8A illustrates an example of the controller directing a column decode circuitry to transform the data from a matrix configuration to a linear configuration. As shown in FIG. 8A, the controller directs a column decode circuitry 852 to transform a matrix configuration 870 to a linear configuration 869. The matrix configuration 870 includes matrices 870-1 . . . 870-K. The column decode circuitry organizes data to correspond to the linear configuration 869 by retrieving bits from successive rows of successive matrices 870-1 . . . 870-K such that the write operation of the linear configuration 869 to the array of memory cells includes bits that correspond to at least one row of the rows of the matrix configuration 870.

FIG. 8B illustrates another example of the controller directing a column decode circuitry to transform the data from a matrix configuration to a linear configuration. As shown in FIG. 8B, the controller directs a column decode circuitry 852 to transform a matrix configuration 870 to a linear configuration 869. The matrix configuration 870 includes matrices 870-1 . . . 870-K. The column decode circuitry organizes data to correspond to the linear configuration 869 by retrieving bits from successive columns of successive matrices 870-1 . . . 870-K such that the write operation of the linear configuration 869 to the array of memory cells includes bits that correspond to at least one column of the columns of the matrix configuration 870.

FIG. 8C illustrates another example of the controller directing a column decode circuitry to transform the data from a matrix configuration to a linear configuration. As shown in FIG. 8C, the controller directs a column decode circuitry 852 to transform a matrix configuration 870 to a linear configuration 869. The matrix configuration 870 includes matrices 870-1 . . . 870-K. The column decode circuitry organizes data to correspond to the linear configuration 869 by retrieving bits from successive columns of successive matrices 870-1 . . . 870-K such that the write operation of the linear configuration 869 to the array of memory cells 130 includes bits that correspond to at least one diagonal of the matrix configuration 870, such as a diagonal that begins at the top left of the matrix 870-1 of FIG. 8C and ends at the bottom right of the matrix 870-1 of FIG. 8C. Said diagonal traverses the four rows and four columns of the matrix 870-1 of FIG. 8C.

Ordinal positioning, as used herein, is used to distinguish between relative positions of elements within respective groups of elements. For example, a plurality of subarrays may each include a sequence of 1024 rows (e.g., row 0 through row 1023). In this example, row 0 from a particular subarray (e.g., a first row of the particular subarray) has a different ordinal position than any of rows 1 through row 1023 (e.g., a last row) of the other subarrays. However, use herein of ordinal numbers such as "first" and "second" is not intended to indicate a particular ordinal position of an element, unless the context clearly dictates otherwise. For example, consider a row having an ordinal position of row 0 within a particular subarray and a different row having an ordinal position of row 4 in a different subarray. In this example, row 0 might be referred to as a "first" row and row 4 might be referred to as a "second" row, despite not having an ordinal position of row 2. Alternatively, row 4 might be referred to as a "first" row and row 0 might be referred to as a "second" row.

In the above detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and structural changes may be made without departing from the scope of the present disclosure.

As used herein, designators such as "X", "Y", "N", "M", "K", etc., particularly with respect to reference numerals in the drawings, indicate that a number of the particular feature so designated may be included. It is also to be understood that the terminology used herein is for the purpose of describing particular embodiments only, and is not intended to be limiting. As used herein, the singular forms "a", "an", and "the" include singular and plural referents, unless the context clearly dictates otherwise, as do "a number of", "at least one", and "one or more" (e.g., a number of array of memory cells may refer to one or more array of memory cells), whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically for access to and/or for movement (transmission) of instructions (e.g., control signals, address signals, etc.) and data, as appropriate to the context. The terms "data" and "data values" are used interchangeably herein and may have the same meaning, as appropriate to the context (e.g., one or more data units or "bits").

While example embodiments including various combinations and configurations of read/latch circuitry, sense amplifiers, column decode circuitry, multiplexers, write circuitry, read/latch stripes, I/O components, subarray decoders, mode registers, and/or row decoders, among other circuitry for organizing in a matrix or transforming from a matrix to a linear configuration shown and described herein, have been illustrated and described herein, embodiments of the present disclosure are not limited to those combinations explicitly recited herein. Other combinations and configurations of read/latch circuitry, sense amplifiers, multiplexers, column decode circuitry, write circuitry, read/latch stripes, I/O components, subarray decoders, mode registers, and/or row decoders, among other circuitry for organizing in a matrix or transforming from a matrix to a linear configuration, disclosed herein are expressly included within the scope of this disclosure.

Although specific embodiments have been illustrated and described herein, those of ordinary skill in the art will appreciate that an arrangement calculated to achieve the same results may be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   an array of memory cells;
   a data interface;
   a column decode circuitry coupled between the array of memory cells and the data interface; and a controller coupled to the array of memory cells, the controller configured to cause the apparatus to:

perform a number of prefetch operations, wherein each of the number prefetch operations transfer a particular amount of data from the array of memory cells to a number of sense amplifiers and wherein the particular amount of data corresponds to an amount of data in a matrix having a matrix configuration; and organize the particular amount of data to correspond to a portion of the matrix configuration by selecting a first portion of the particular amount of data to transfer from a number to sense amplifiers to a processing resource.

2. The apparatus of claim 1, wherein the first portion of the particular amount of data corresponds to a row of the matrix configuration.

3. The apparatus of claim 1, wherein the matrix configuration is stored in a register on the apparatus.

4. The apparatus of claim 1, wherein the column decode circuitry is configured to send the first portion of the particular amount of data to the processing resource.

5. The apparatus of claim 1, wherein the controller is further configured to cause the column code circuitry to select the first portion of the particular amount of data.

6. The apparatus of claim 1, wherein a read operation stores the particular amount of data in the number of sense amplifiers.

7. The apparatus of claim 1, wherein the controller configured to cause the apparatus to select a second portion of the particular amount of data that to corresponds to the matrix configuration.

8. The apparatus of claim 7, wherein the second portion of the particular amount of data corresponds to a second row of the matrix configuration.

9. The apparatus of claim 7, wherein the column decode circuitry is configured to send the second portion of the particular amount of data to the processing resource.

10. A method, comprising:

performing a number of prefetch operations, wherein each of the number prefetch operations transfer a particular amount of data from an array of memory cells to a number of sense amplifiers and wherein the particular amount of data corresponds to an amount of data in a matrix having a matrix configuration; and organize the particular amount of data to correspond to a portion of the matrix configuration by selecting a first portion of the particular amount of data to transfer from the number to sense amplifiers to a processing resource.

11. The method of claim 10, wherein selecting the first portion of the particular amount of data corresponds to a first row of the matrix configuration.

12. The method of claim 10, wherein selecting the first portion of the particular amount of data corresponds to a first column of the matrix configuration.

13. The method of claim 10, further including selecting a second portion of the particular amount of data to correspond to the matrix configuration to transfer from the number to sense amplifiers to the processing resource.

14. The method of claim 13, wherein the second portion of the particular amount of data corresponds to a second row of the matrix configuration.

15. The method of claim 13, wherein second portion of the particular amount of data corresponds to a second column of the matrix configuration.

16. A method, comprising:

performing a number of prefetch operations, wherein each of the number prefetch operations reads a particular amount of data from an array of memory cells on a memory device and stores the particular amount of data in a number of sense amplifiers on the memory device and wherein the particular amount of data corresponds to an amount of data in a matrix having a matrix configuration that is stored in a register of the memory device; and selecting a first number of bits of the particular amount of data that correspond to a first portion of the matrix configuration to transfer from the number to sense amplifiers to a processing resource.

17. The method of claim 16, wherein selecting the first number of bits includes selecting data stored in consecutive sense amplifiers.

18. The method of claim 17, wherein the first number of bits corresponds to a first row of the matrix configuration.

19. The method of claim 16, wherein selecting the first number of bits includes selecting data stored in every eighth sense amplifier starting with a first sense amplifier.

20. The method of claim 19, wherein the first number of bits corresponds to a first column of the matrix configuration.

* * * * *